(12) United States Patent
Gee et al.

(10) Patent No.: US 8,975,609 B2
(45) Date of Patent: Mar. 10, 2015

(54) THREE DIMENSION PROGRAMMABLE RESISTIVE RANDOM ACCESSED MEMORY ARRAY WITH SHARED BITLINE AND METHOD

(71) Applicant: Crossbar, Inc., Santa Clara, CA (US)

(72) Inventors: Harry Gee, Sunnyvale, CA (US); Sung Hyun Jo, Sunnyvale, CA (US); Hagop Nazarian, San Jose, CA (US); Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 74 days.

(21) Appl. No.: 13/862,353

(22) Filed: Apr. 12, 2013

(65) Prior Publication Data

US 2013/0234092 A1   Sep. 12, 2013

Related U.S. Application Data

(62) Division of application No. 13/341,835, filed on Dec. 30, 2011, now Pat. No. 8,426,306.

(60) Provisional application No. 61/428,983, filed on Dec. 31, 2010.

(51) Int. Cl.
| | |
|---|---|
| *H01L 47/00* | (2006.01) |
| *H01L 45/00* | (2006.01) |
| *H01L 21/4763* | (2006.01) |
| *G11C 13/00* | (2006.01) |
| *H01L 27/24* | (2006.01) |

(52) U.S. Cl.
CPC ............ *H01L 45/12* (2013.01); *H01L 21/4763* (2013.01); *G11C 13/0007* (2013.01); *H01L 45/085* (2013.01); *H01L 45/1226* (2013.01); *H01L 45/1266* (2013.01); *H01L 45/148* (2013.01); *H01L 45/16* (2013.01); *H01L 27/249* (2013.01)
USPC .......... 257/2; 257/4; 257/5; 438/622

(58) Field of Classification Search
CPC ................... H01L 45/12; H01L 45/04
USPC ........................ 257/2, 4–5; 438/622
See application file for complete search history.

(56) References Cited

U.S. PATENT DOCUMENTS 7,876,597 B2 * 1/2011 Liu ............................ 365/148
8,772,852 B2 * 7/2014 Kim et al. .................... 257/315

*Primary Examiner* — Theresa T Doan
(74) *Attorney, Agent, or Firm* — Ogawa P.C.

(57) ABSTRACT

A method of forming a non-volatile memory device. A substrate is provided and a first dielectric material forms overlying the substrate. A first polysilicon material is deposited overlying the first dielectric material. A second dielectric material is deposited overlying the first polysilicon material. A second polysilicon material is deposited overlying the second dielectric material. A third dielectric material is formed overlying the second polysilicon material. The third dielectric material, the second polysilicon material, the second dielectric material, and the first polysilicon material is subjected to a first pattern and etch process to form a first wordline associated with a first switching device and a second wordline associated with a second switching device from the first polysilicon material, a third wordline and associated with a third switching device, and a fourth wordline associated with a fourth switching device from the second polysilicon material. A via opening is formed to separate the first wordline from the second wordline and to separate the third wordline from the fourth wordline. An amorphous silicon switching material is deposited conformably overlying the via opening. A metal material fills the via opening and overlies the amorphous silicon material and connected to a common bitline.

20 Claims, 13 Drawing Sheets

THREE DIMENSION PROGRAMMABLE RESISTIVE RANDOM ACCESSED MEMORY ARRAY WITH SHARED BITLINE AND METHOD

CROSS REFERENCE TO RELATED APPLICATIONS

This application claims priority to non-provisional application Ser. No. 13/341,835 filed on Dec. 30, 2011, which claims priority to provisional application 61/428,983 filed on Dec. 31, 2010 commonly assigned, and incorporated by reference herein.

BACKGROUND

The present invention is generally related to resistive switching devices. More particularly, embodiments according to the present invention provide a method and a structure for forming a multilayer stacked resistive switching device for one or more memory device layers. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires a large amount of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

Embodiments according to present invention are related to switching device. More particularly, embodiments according to the present invention provide a method and a structure for a multilayer vertically stacked memory device. The stacked memory structure allows for a reduced feature size per device. Furthermore, a common bit line connecting a vertical conductor structure for the memory devices on the different layers reduces process steps and simplifies fabrication. Embodiments according to the present invention have been applied to a non-volatile memory device, but it should recognize that embodiments according to the present invention can have a greater range of applicability.

In a specific embodiment, a method of forming a non-volatile memory device is provided. The method includes providing a substrate having a surface region and forming a first dielectric material overlying the surface region of the substrate. A first conductor material is formed overlying the first dielectric material. In a specific embodiment, the first conductor material includes a first polysilicon material. The method deposits a second dielectric material overlying the polysilicon material and forming a second conductor material overlying the second dielectric material. The second conductor material includes a second polysilicon material. A third dielectric material is formed overlying the second conductor material and a masking layer is formed overlying the third dielectric material. In a specific embodiment, the method subjects the third dielectric material, the second conductor material, the second dielectric material, and the first conductor material to a first pattern and etch process to form at least a first wordline associated with a first switching device and a second wordline associated with a second switching device from the first conductor material, a third wordline and associated with a third switching device a fourth wordline associated with a fourth switching device from the from the second conductor material. The first pattern and etch process further forms a via opening separating the first wordline from the second wordline and separating the third wordline from the fourth wordline. The method forms a resistive switching material in a first portion of the via opening conformably overlying the via opening. The resistive switching material comprises an amorphous silicon material in a specific embodiment. A metal material is formed in a second portion of the via opening overlying the amorphous silicon material and substantially filling the via opening. The metal material is connected to a common bitline for each of the first switching device, the second device, the third switching device, and the fourth switching device in a specific embodiment.

In a specific embodiment, a non-volatile memory device is provided. The non-volatile memory device includes a substrate having a surface region and a first dielectric material overlying the surface region of the substrate. non-volatile memory device includes a first wordline and a second wordline overlying the first dielectric material. The first wordline is associated with a first resistive switching device and the second wordline is associated with a second resistive switching device in a specific embodiment. A second dielectric material overlies the first wordline and the second wordline. The non-volatile memory device includes a third wordline and a fourth wordline overlying the second dielectric material. In a specific embodiment, the third wordline is associated with a third resistive switching device and the fourth wordline being associated with a fourth resistive switching device. The non-volatile memory device includes a resistive switching material conformably configured overlying a via structure. The via structure is configured to extend at least in the second dielectric material overlying the first dielectric material between the first wordline and the second wordline and abutting the first wordline and the second wordline, and between the third wordline and the fourth wordline and abutting the third wordline and the fourth wordline. A metal material is disposed in the via structure overlying the resistive switching material. In a specific embodiment, the non-volatile memory device includes a single bitline connecting to the metal material in the via structure. The single bitline is configured to electrically connect the first resistive switching device, the second resistive switching device, the third resistive switching device, and the fourth resistive switching device to a control circuit on the substrate.

Many benefits can be achieved by ways of the present invention. For example, the metal (for example, silver) can be formed by a single step using a damascene process, which eliminates a plasma etch or a dry etch process for the silver material. Additionally, a single via structure provides for an amorphous silicon switching material and the silver electrode. The single via structure allows for deposition of the amorphous silicon switching material and the silver in a single step after forming multiple p+ polysilicon wordlines for a three-dimensional vertically stacked memory cells. Embodiments according to the present invention further provide for a method and structure to form metal interconnects to the controlling CMOS after forming the vertically three-dimensionally stacked memory cells that can be fully integrated into a CMOS process flow. The 3D vertically stacked memory cell configuration reduces cell area per bit for the device. Of course one skilled in the art would recognize other modifications, variations, and alternatives

DETAILED DESCRIPTION OF THE PRESENT INVENTION

The present invention is related to switching device. More particularly, embodiments according to the present invention provide a method and a structure for a multilayer stacked memory device. The stacked memory structure allows for a reduced feature size per device. Furthermore, a common bit line connecting a vertical conductor structure for the memory devices on the different layers reduces process steps and simplifies fabrication. Embodiments according to the present invention have been applied to a non-volatile memory device, but it should recognize that embodiments according to the present invention can have a greater range of applicability.

The growth of consumer devices has led to an ever increasing demand for high density memory storage at a low cost per bit. Data storage of current non-volatile memory devices are based on charges stored in a floating gate or a dielectric layer. Scaling of these devices is limited as these devices usually require a transistor device coupled to a memory cell. Further down scale of transistors may not be possible due to short channel effects and others. Additionally, as these devices are three terminal devices, vertical or three dimensional integration of memory cells are difficult to achieve. Memory cells or switching devices arranged in a crossbar configuration provides a method and a structure for high density integration at a much reduced cost.

To achieve a higher density of cells, multilayer of crossbar array of cells can be stacked vertically. Each layer of cells is separated by a dielectric material layer. If a bitline is required for each cell, metallization for each layer of cells would have to be provided. Embodiments according to the present invention provides a device structure for a single bitline to connect to more than one cells in each layer, greatly reduce the number metallization steps. Additionally, depending on the number of device layer fabricated, the present device structure can have a device size less that about $1F^2$, where F is a minimum feature size of a cell. Of course one skilled in the art would recognize other variations, modifications, and alternatives.

Figure 1:
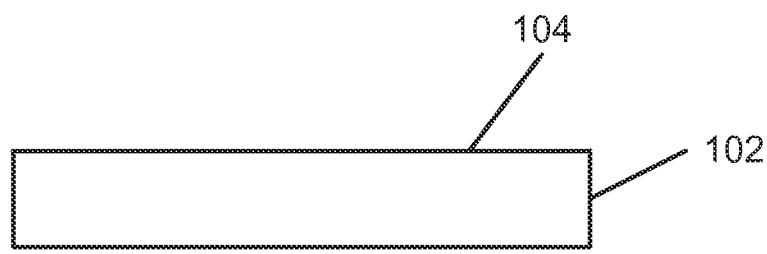
FIGS. 1-9, 9a, 10-17 illustrate a method of forming a non-volatile memory device according to an embodiment of the present invention.

FIG. 1-17 are simplified diagrams illustrating a method of forming a non-volatile memory device according to an embodiment of the present invention. These diagrams are merely examples and should limit the scope of the claims herein. One skilled in the art would recognize other variations, modifications, and alternatives. As shown in FIG. 1, a semiconductor substrate 102 having a surface region 104 is provided. The semiconductor substrate can be a single crystal silicon material, a silicon germanium material, or a silicon on insulator substrate, and the likes, depending on the embodiment. Depending on the embodiment, the substrate can have one or more transistor device as control circuits for the device in a specific embodiment.

Figure 2:
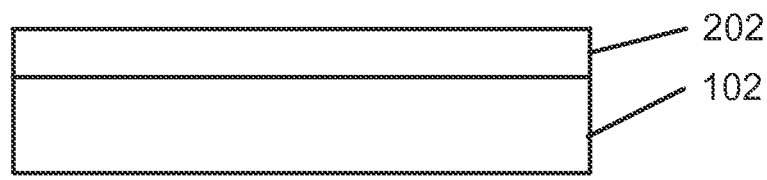

Referring to in FIG. 2, a first dielectric material 202 is formed overlying the surface region of the semiconductor substrate. The first dielectric material can be silicon oxide, silicon nitride, a dielectric stack including alternating silicon oxide on silicon nitride on silicon oxide (commonly called ONO), a low K dielectric material, a high K dielectric material or a combination of these, and others, depending on the application. In certain embodiments, the first dielectric material can be silicon oxide capped with a silicon nitride. Silicon nitride inhibits metal diffusion and contamination to the transistor devices on the substrate in a specific embodiment.

Figure 3:
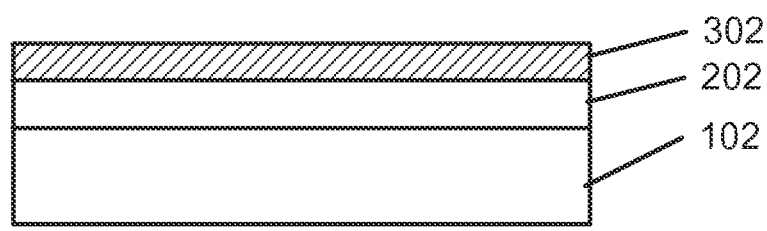

As shown in FIG. 3, a first conductor material 302 is deposited overlying the first dielectric material as illustrated in FIG. 3. In a specific embodiment, the first conductor material can be a first polysilicon material has a p+ impurity characteristic. The polysilicon material may be deposited using chemical vapor deposition process such as low pressure chemical vapor deposition process; plasma enhanced chemical vapor deposition process, and other suitable techniques. Precursors such as silane, a chlorosilane such as dichlorosilane and trichlorosilane may be used. Depending on the application, the first polysilicon material may be deposited using a physical vapor deposition process from a silicon target material. In a specific embodiment, the p+ impurity characteristic can be derived from a boron species or an aluminum species, or others. As an example, the boron species can be in-situ doped or ex-situ doped depending on the embodiment. In certain embodiment, the first conductor material can be a silicon germanium material having a p+ impurity characteristic. Silicon germanium material has a lower deposition temperature than a polysilicon silicon material allowing a lower thermal budget for fabrication of the memory device.

Figure 4:
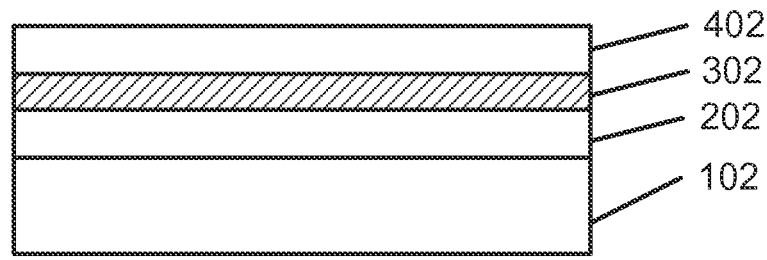

As shown in FIG. 4, the method includes forming a first masking layer 402 overlying the first conductor material 302. First masking layer 402 includes at least a first hardmask material and a photomask in a specific embodiment. The first hardmask material can be a dielectric material in a specific embodiment. Alternatively, the first hardmask material can be materials such as titanium nitride, metal material and other suitable material.

Figure 5:
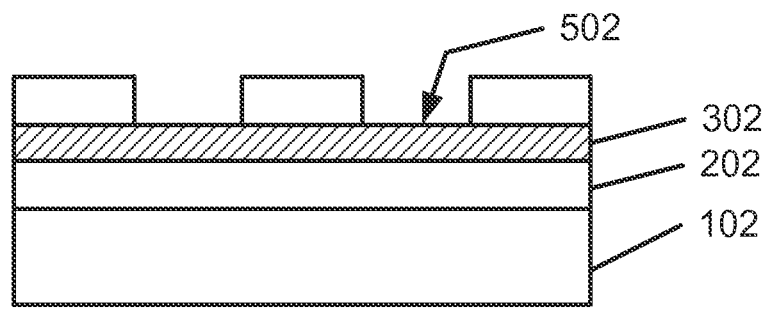
Figure 6:
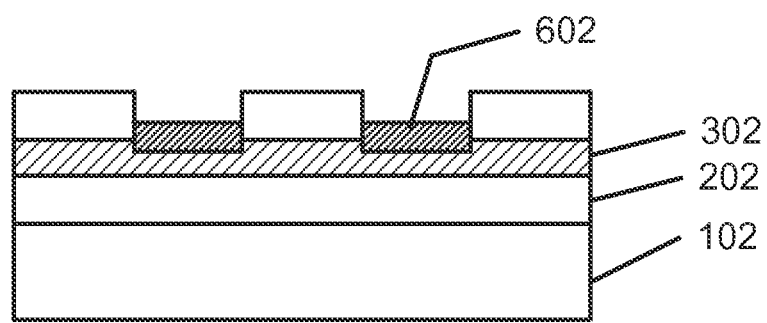
Figure 7:
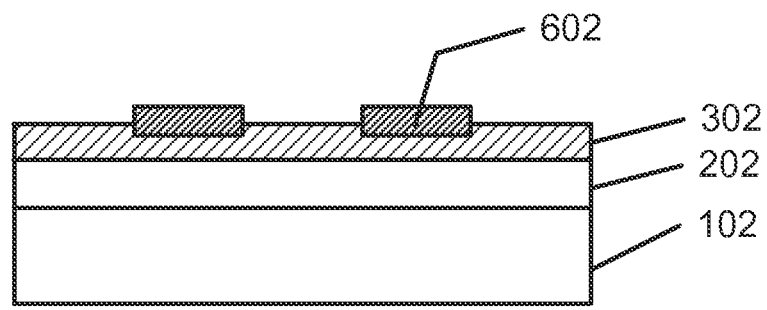

In a specific embodiment, the method includes subjecting first masking layer 402 (for example the first hardmask material) to a first patterning and etching process to remove portions of first masking layer 402 and to expose a surface region 502 of the first polysilicon material 302 as shown in FIG. 5. A metal material (not shown) is formed overlying the first polysilicon material. A metal silicide material 602 is formed from the metal material and a portion the polysilicon material as shown in FIG. 6 upon an anneal process. Metal silicide material 602 provides a desirable conductivity characteristic. Depending on the embodiment the metal material may be cobalt, nickel, tungsten, and others. The method removes the first masking layer from the polysilicon material if the hardmask material is not a dielectric material as shown in FIG. 7.

Figure 8:
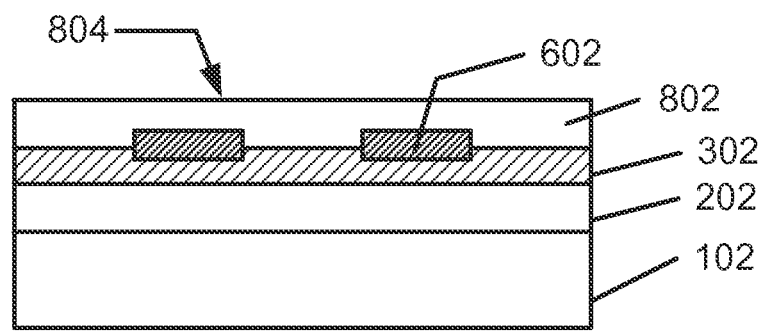

Referring to FIG. 8, a second dielectric material 802 is formed overlying the polysilicon material 302 and the metal silicide material 602. Second dielectric material 802 is subjected to a first planarization process to form a planarized surface 804, as shown.

Figure 9:
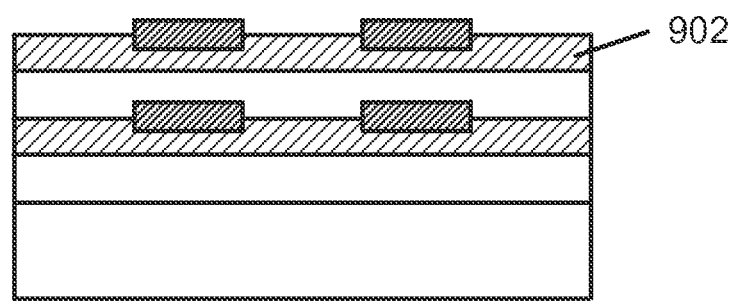
Figure 9A:
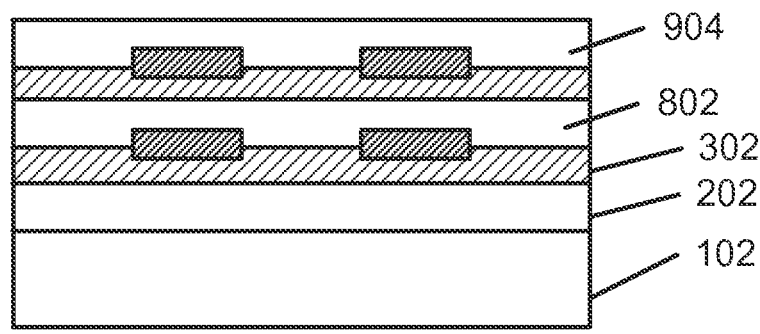

In a specific embodiment, the method includes depositing a second polysilicon material 902 overlying the second dielectric material as shown in FIG. 9. The method forms silicide regions on the second polysilicon material using similar steps for the first polysilicon material. A third dielectric material 904 is deposited overlying the second polysilicon material as shown in FIG. 9a in a specific embodiment.

Figure 10:
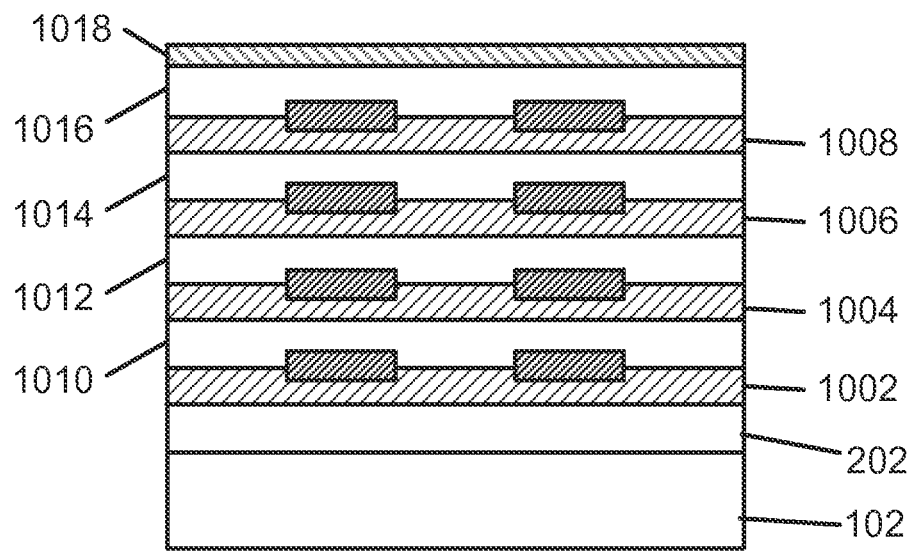

The method continues with the above sequence of steps to provide for a multilayer memory cell structure. As merely an example, four layers of polysilicon material including the silicide regions provides for a first conductor layer 1002, second conductor layer 1004, a third conductor layer 1006, and a fourth conductor 1008 are illustrated. Each of the conductor layers are separated by a respective dielectric material layers 1010, 1012, and 1014. A top dielectric material 1016 including a cap dielectric material 1018 is formed overlying the fourth conductor layer 1008, as shown in FIG. 10.

Figure 11:
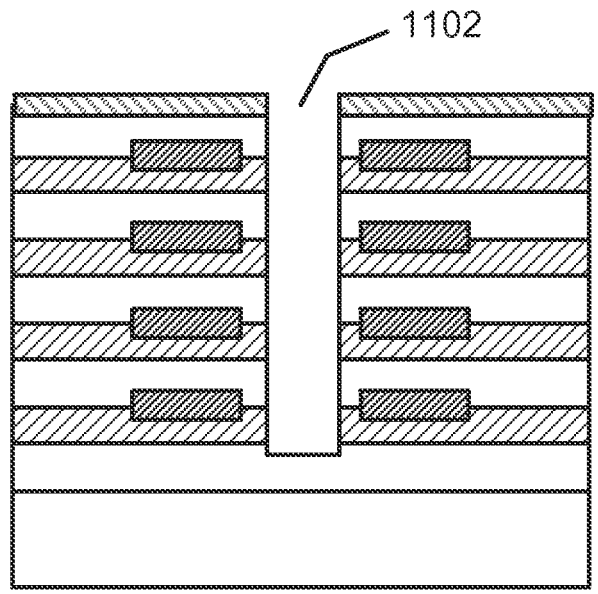

Referring to FIG. 11, the method includes forming a via opening 1102 using a second patterning and etching process. As shown, the second patterning and etching process uses the cap dielectric material as a hardmask in a specific embodiment. The via structure is configured through each of the dielectric material layers 1010, 1012, and 1014 and each of the polysilicon material layers and extending to a portion of the first dielectric material in a specific embodiment. As shown, the via opening is contiguous with the polysilicon material in a specific embodiment.

Figure 12:
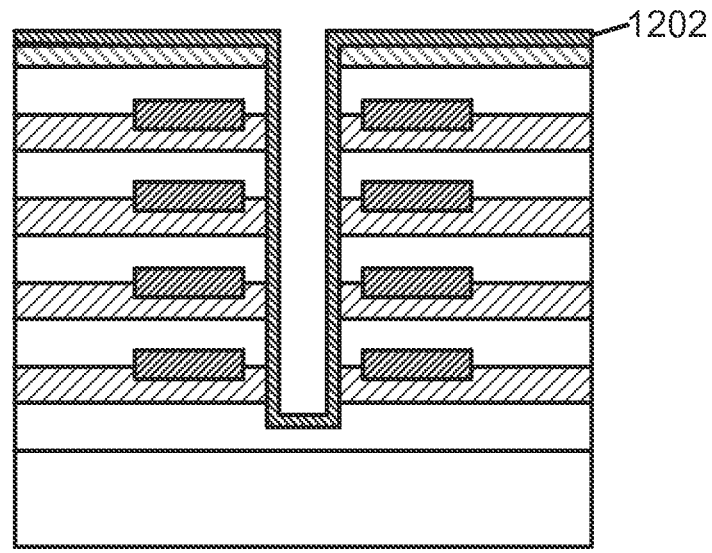
Figure 13:
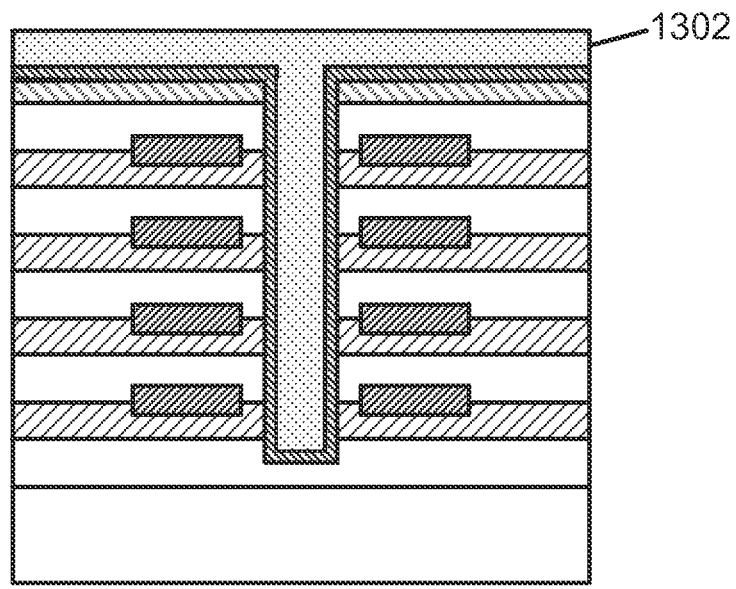

As shown in FIG. 12, a switching material 1202 is deposited in a first portion of via opening 1102. Switching material 1202 overlies the via opening 1102 and the top dielectric material 1016, as shown. In a specific embodiment, switching material 1202 is substantially conformal to the via opening. In a specific embodiment, the switching material 1202 is an amorphous silicon material. The amorphous silicon material is essentially intrinsic, that is not intentionally doped. The amorphous silicon material may be deposited using a low pressure chemical vapor deposition using precursors such as slime or a chlorosilane at a deposition temperature of about 550 Degree Celsius to about 600 Degree Celsius. The amorphous silicon material may also be deposition using a plasma enhanced chemical vapor deposition using precursors such as silane or a chlorosilane at a deposition temperature of about 250 Degree Celsius to about 450 Degree Celsius. Alternatively, a physical vapor deposition process using a suitable silicon target material may be used. The amorphous silicon material can have a thickness ranging from about 20 nanometers to about 100 nanometers depending on the embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 Å per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

The method deposits a metal material 1302 in a second portion of the via opening and substantially fills the via opening and overlying switching material 1202. For an amorphous silicon material as the switching material, the metal material can include: gold, silver, palladium, platinum, nickel, aluminum, and others. In certain embodiments, metal material 1302 is silver. Metal material 1302 is preferably characterized by a suitable diffusivity in switching material 1202 (for example, the amorphous silicon material) in the presence of an electric field under various operating voltages (write or erase) in a specific embodiment. Depending on the embodiment, metal material 1302 may be deposited using a physical vapor deposition process using a metal target material, or a chemical vapor deposition process, or an electrochemical process such as electroplating or electroless deposition, including any combinations of these techniques. Depending on the deposition technique, metal material 1302 can completely fill the via opening or may leave a keyhole void. The keyhole void should not affect operations of the device.

In various embodiments of the present invention, a thin insulating layer (e.g. oxide, nitride, etc.) is formed prior to the deposition of the metal (e.g. silver) material on top of the undoped amorphous silicon switching material. This interposing thin insulating layer may be naturally or specifically grown or formed, and one or more etch operations (e.g. HF etch, Argon etch) may help control the thickness of this insulating layer. In some embodiments, a thickness of an insulating oxide, prior to deposition of the metal material 1202 may range from about 20 angstroms to about 50 angstroms; in other embodiments, the thickness may range from about 30 angstroms to about 40 angstroms; or the like.

Figure 14:
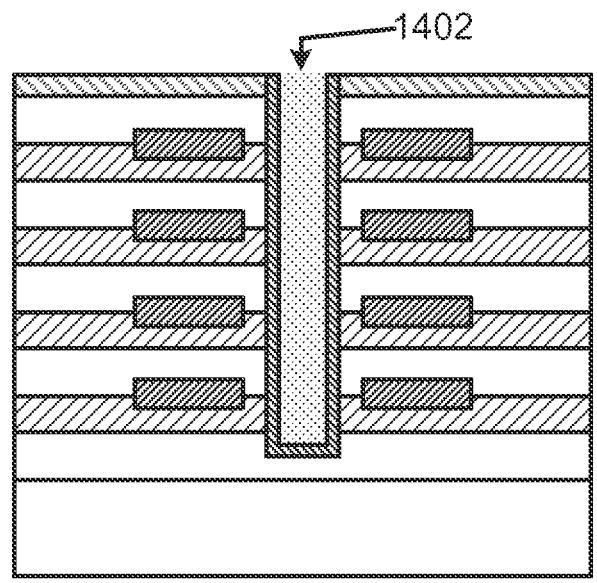

In a specific embodiment, metal material 1302 is subjected to a second planarizing process. The second planarizing process further removes a portion of the amorphous silicon material and stops at the cap dielectric material as illustrated in FIG. 14. Cap material 1018 provide as a polishing stop or an etch stop depending on the second planarizing process used. In a specific embodiment, the second planarizing process exposes a surface region 1402 of the metal material in the via opening and isolates the metal material in each of the via structure in a specific embodiment.

Figure 15:
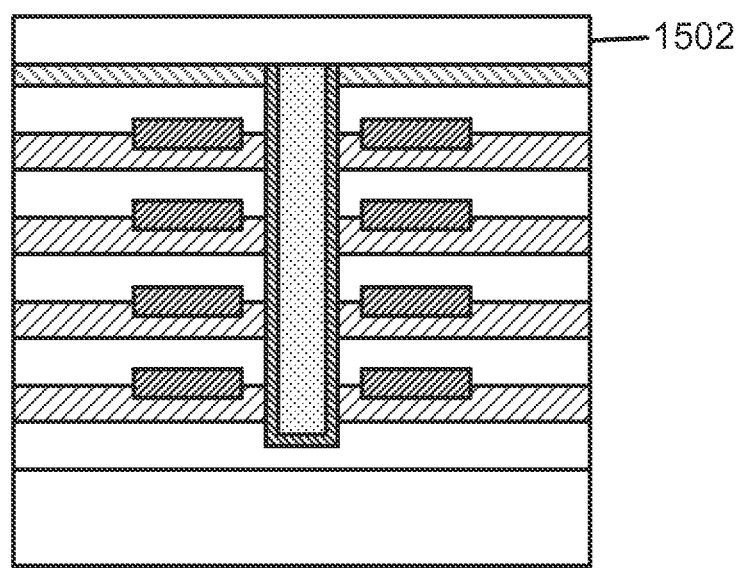
Figure 16:
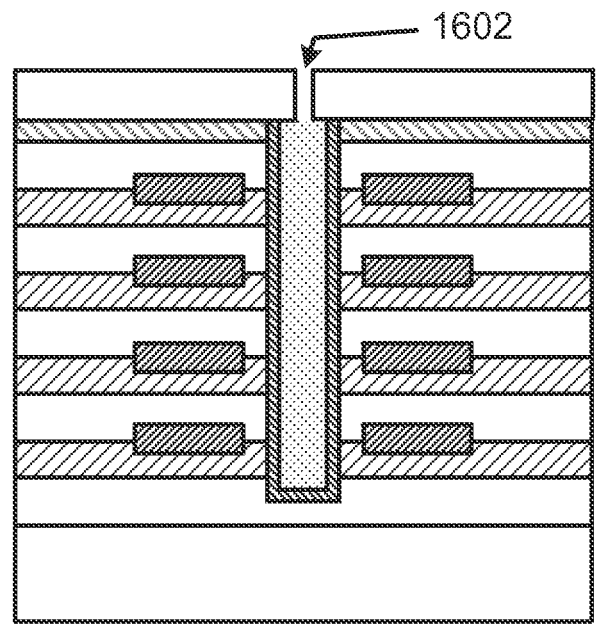
Figure 17:
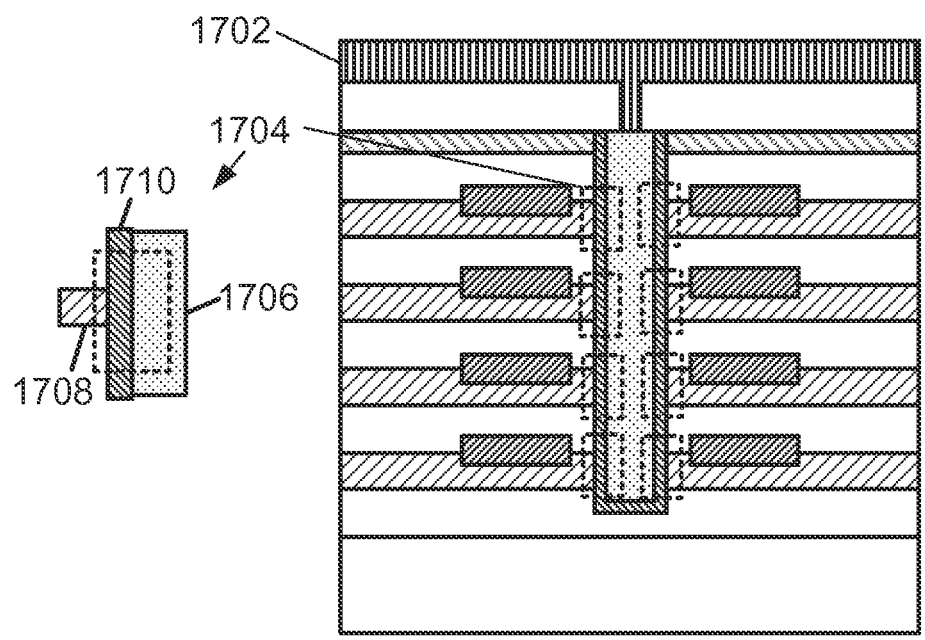

Referring to FIGS. 15-17. In a specific embodiment, the method includes depositing a fifth dielectric material 1502 overlying the planarized cap dielectric material and the exposed surface region of the meal material in the via opening. The fifth dielectric material is subjected to a third patterning and etching process to form an opening 1602 for a bitline contact structure as shown in FIG. 16. The method includes depositing a second conductor material 1702 to fill the opening and to form a bitline to connect the metal material to a control circuitry as shown in FIG. 17 in a specific embodiment. The second conductor material can be a suitable metal material such as tungsten, copper, aluminum or silver, depending on the application.

Further shown in FIG. 17, for a four layer device structure, a single via structure 1702 connects to eight switching devices to the bitline. Each of the switching devices (1704 is shown) includes a first electrode 1706 formed from the metal material, a second electrode 1708 formed from a conductor material, and a switching element 1710 formed from a portion of the switching material to form an interconnected crossbar structure in a specific embodiment. An expanded view is also shown. In a specific embodiment, first electrode 1706 comprises a silver material, the switching material comprises an amorphous silicon material, and the second electrode 1708 comprises a polysilicon material in a specific embodiment. The amorphous silicon material is not intentionally doped and has an intrinsic semiconductor characteristic in certain embodiments. In a specific embodiment, the silver material is caused to inject into a portion of the switching region and forms a silver region when a positive bias is applied to the line 1702. The silver region further includes a filament structure characterized by a length dependent on an operating voltage applied to the first electrode (bitline) or the second electrode (wordline) according to various aspect of the embodiments. The switching element is characterized by a resistance depending on the applied operating voltage in a specific embodiment.

Figure 18:
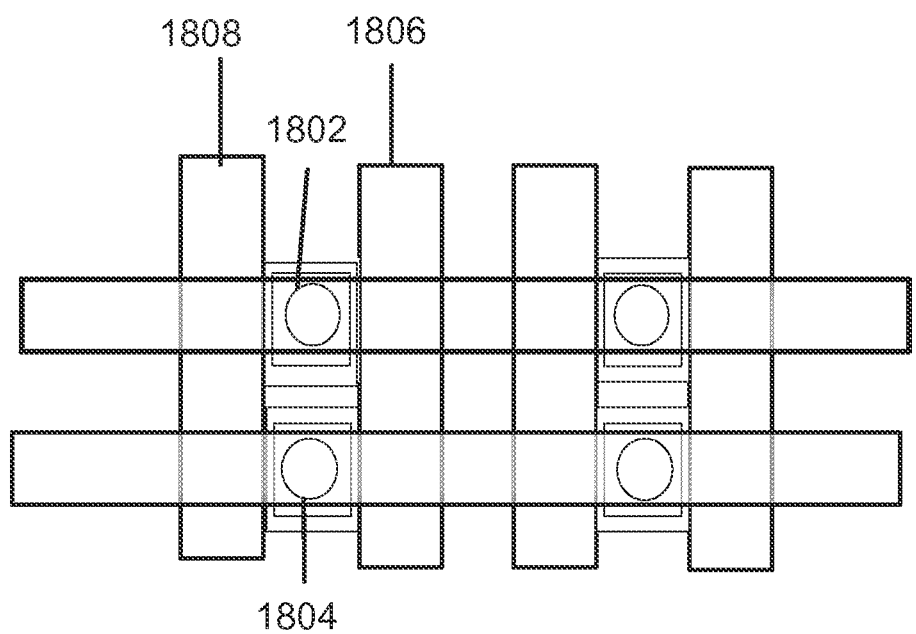
FIG. 18 is a simplified top view diagram illustrating an array of non-volatile memory device according to an embodiment of the present invention.

A top view diagram of the four layer device as in FIG. 17 is illustrated in FIG. 18. A first bitline 1802 and a second bitline 1804 are shown. Reference 1808 represents a first wordline stack and reference 1806 represents a second wordline stack. Each of the bitline is connected to eight wordlines and can have at least eight bits for each bitline for the four layer device. As shown, each device has a feature size of about $10F^2$, where F is a cell size. Depending on the process, for the four wordline layer stack, the equivalent device area is about $1F^2$ per cell.

Figure 19:
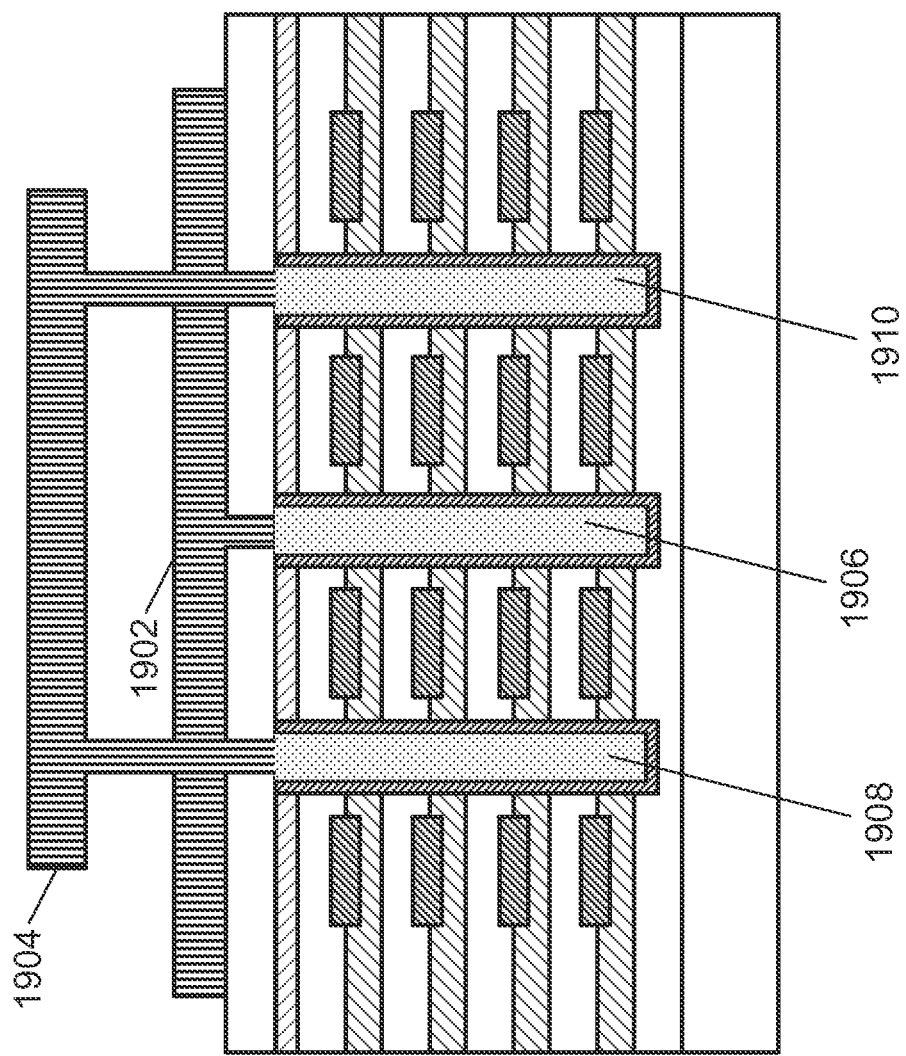
FIG. 19 is a simplified cross sectional view diagram illustrating an alternative non-volatile memory device according to an embodiment of the present invention.
Figure 20:
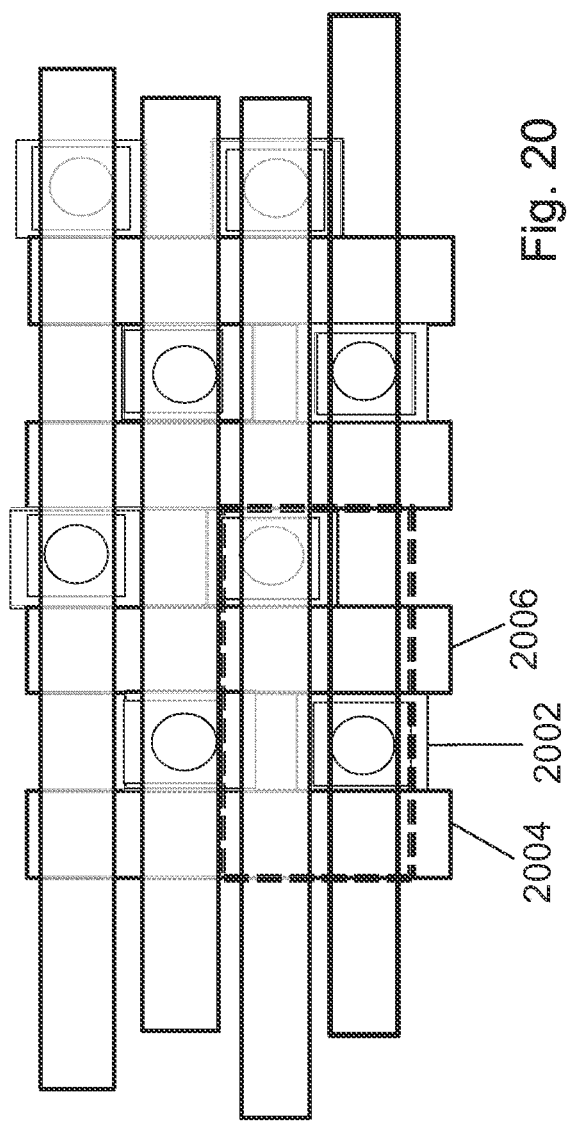
FIG. 20 is a simplified top view diagram illustrating an array of non-volatile memory device according to an embodiment of the present invention.

FIG. 19 illustrates an alternative bitline configuration for a four layer device. Again, four wordline layers are illustrated. A first metal bitline 1902 is connected to a first common metal material in first via structure 1906. A second metal bitline 1904 is common to the metal material in a second via structure 1908 and a third via structure 1910 and disposed in a region above the first metal bitline. In this configuration, cell height is increased to accommodate two staggered metal bitlines. In this configuration, 8 cells are connected to bitline 1902 and 8 cells are connected to bitline 1904. Again, depending on the process, a total area of about $20F^2$ for the device and an equivalent area of $1F^2$ per cell. A top view diagram is illustrated in FIG. 20. A first via structure 2002 and a first stack of wordlines 2004 and a second stack of wordlines 2006 are illustrated.

Figure 21:
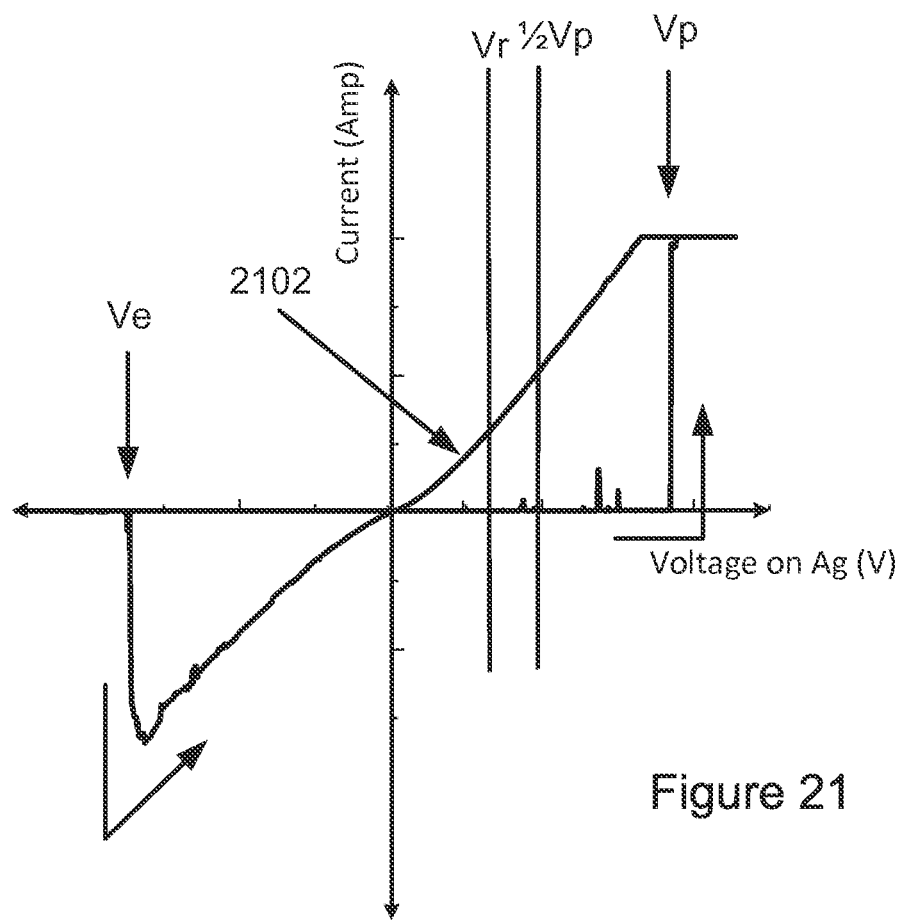
FIG. 21 is a simplified voltage against current (I-V) plot for during operation for a non-volatile memory device according to an embodiment of the present invention.

FIG. 21 is an exemplified plot of current against voltage (I-V) of a switching device according to an embodiment of the present invention. Plot 2102 illustrates a programming IN characteristic of the switching device. As shown, as voltage is increased to a threshold voltage for programming Vp, the electrical resistance of the switching decreases and current flows in the switching device. As shown, to perform an erase cycle, an erase voltage Ve, opposite in polarity of the programming voltage is applied to the bit line or the wordline associated with the switching device, Ve~–Vp. To determine a state of the switching device, a read voltage is applied. The read voltage has a magnitude of about half of the programming voltage or Vr=½Vp. If the device is in programmed state or a low resistance state, upon application of the read voltage, a current flows in the device. If the device is at an erased state, a negligible current or a current no greater than a pre-determined current flows in the device upon application of the read voltage.

As noted, the present array can have eight cells per bitline or eight bits per bit line for a four layer device. Each bit has a single wordline as illustrated in FIG. 17. To program a single bit, or a single cell, a programming voltage is applied to the bitline while the associated wordline is floating or at ground. The wordline for the other cells of the common bitline is maintained at a voltage of ½Vp. Other unassociated bitlines are maintained at ½Vp or float to ensure that other cells of the same bitline would not be programmed unintentionally or being disturbed.

In other applications, the entire eight bits control by the bitline may be programmed. In this case, a programming voltage Vp is applied to a first bit line, all the eight wordlines associated with the first bitline is at ground for programming or float for not programming. A second stack of adjacent eight wordlines sharing the first bitline are maintained at ½Vp or float, to avoid disturb. Additionally, other bitlines are also maintained at ½Vp or float. To erase one or more cells, bitline of the cells to be erased is maintained at 0 volt and an erase voltage Ve is applied to a wordline associated with the cells to be erased. An unassociated bitline is maintained at ½Ve or floating and an unassociated wordline can be at a same voltage of ½Ve as an unassociated bitline or floating.

Various read mechanisms may be employed. For a block read, for example, a wordline block read, a read voltage Vr is applied to the bitlines while the target wordline is ground and a voltage of Vr is applied other wordlines in the array. A sense on each of the wordline is performed. Alternatively, a sense bit line mechanism in which eight read cycles is needed to read each bit. For example, a first read cycle applies a read voltage Vr to all the bitlines while a first wordline is grounded and wordlines 2-8 are floating. A second read cycle would again apply the read voltage of Yr to all the bitlines while the first wordline is grounded and wordlines 1 and 3-8 are floating, and so on until all the cells associated with each of the wordlines is sensed. Another read mechanism includes sensing a bitline on one of the eight common wordline. In this mechanism, a read voltage Vr is applied to all the bitlines 1-x while the first wordline is ground and wordline 2-8 are floating. Of course one skilled in the art would recognize other variations, modifications, and alternatives.

Figure 22:
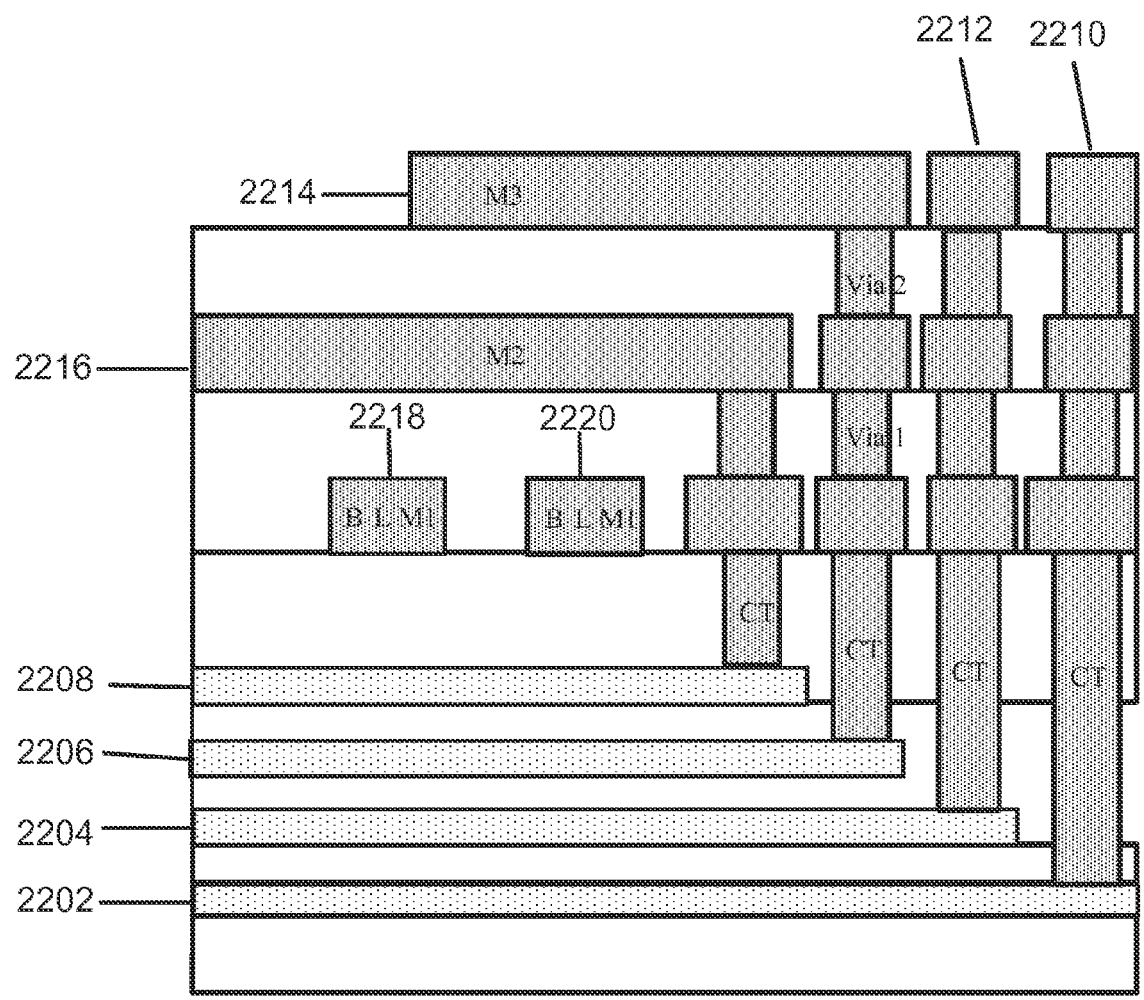
FIG. 22 is a simplified diagram illustrating interconnects for the non-volatile memory device according to an embodiment of the present invention.

Referring to FIG. 22, an exemplified diagram for interconnecting structure for each of the wordlines for a four layer memory device. As shown, a first device layer wordline 2202, a second device layer wordline 2204, a third device layer wordline 2206, and a fourth device layer wordline 2208 are illustrated. As shown, each of the respective wordlines is electrically connected to the respective control circuitry on the substrate using interconnects 2210, 2212, 2214, and 2216. Merely for illustration, a first bitline 2218 and a second bitline 2220 are also shown. Depending on the application, multi-level via structures may be used, as shown.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device; comprising:
    a substrate having a surface region;
    a first dielectric material overlying the surface region of the substrate;
    a first wordline and a second wordline overlying the first dielectric material, the first wordline being associated with a first resistive switching device and the second wordline being associated with a second resistive switching device;
    a second dielectric material overlying the first wordline and the second wordline;
    a third wordline and a fourth wordline overlying the second dielectric material, the third wordline being associated with a third resistive switching device and the fourth wordline being associated with a fourth resistive switching device;
    a resistive switching material conformably configured within a via structure, the via structure being configured to extend at least in the second dielectric material overlying the first dielectric material between the first wordline and the second wordline and abutting the first wordline and the second wordline, and between the third wordline and the fourth wordline and abutting the third wordline and the fourth wordline;
    a metal material disposed in the via structure overlying the resistive switching material,
    a single bitline connecting to the metal material in the via structure and being configured to electrically connect the first resistive switching device, the second resistive switching device, the third resistive switching device, and the fourth resistive switching device to a control circuit on the substrate.

2. The device of claim 1 wherein the first resistive switching device is formed from the first word line, the resistive switching material, and the metal material, the second resistive switching device is formed from the second word line, the resistive switching material, and the metal material, the third resistive switching device is formed from the third word line, the resistive switching material, and the metal material, and the fourth resistive switching device is formed from the fourth word line, the resistive switching material, and the metal material.

3. The device of claim 1 further comprises a third device layer and a fourth device layer, the third device layer and the fourth device layer sharing the common via structure connecting to the common bitline.

4. The device of claim 1 further comprises N device layers connecting to the common bitline using the metal material in the via structure, where N being an integer ranging from 1 to 8.

5. The device of claim 1 wherein the metal material is selected from a group consisting of: gold, silver, palladium, platinum, nickel, and aluminum.

6. The device of claim 1 wherein the resistive switching material is selected from a group consisting of: an amorphous silicon material, an amorphous silicon material that is not intentionally doped, an intrinsic semiconductor material, and a non-crystalline silicon material.

7. The device of claim 1 wherein the first wordline comprises a conductive material selected from a group consisting of: a doped polycrystalline silicon containing layer, a doped silicon germanium material, a metal silicide, a metal containing compound.

8. The device of claim 1 wherein the control circuit comprises one or more transistor devices on the substrate.

9. The device of claim 1
    wherein a portion of the first wordline is exposed by the via;
    wherein a front face of a portion of the resistive switching material contacts the portion of the first wordline exposed by the via; and
    wherein a portion of the metal material contacts a rear face of the portion of the resistive switching material.

10. The device of claim 9 wherein the first resistive switching device comprises the portion of the first wordline, the portion of the resistive switching material, and the portion of the metal material.

11. A device including a non-volatile memory device; comprising:
    a first dielectric material overlying a surface region of a substrate;
    a first wordline overlying the first dielectric material;
    a second dielectric material overlying the first wordline;
    a second wordline overlying the second dielectric material and the first wordline;
    a third dielectric material overlying the second word line;
    a via structure within the third dielectric material, the second wordline, the second dielectric material and the first word line, wherein the via structure exposes a portion of the first wordline and a portion of the second word line;
    a resistive switching material disposed within the via structure, wherein a front face of a first portion of the resistive switching material contacts the portion of the first word line and a front face of a second portion of the resistive switching material contacts the portion of the second word line; and
    a metal material disposed within the via structure, wherein a front face of a first portion of the metal material touches a rear face of the first portion of the resistive switching material, and wherein a front face of a second portion of the metal material touches a rear face of the second portion of the resistive switching material; and
    a bitline coupled to the metal material, wherein the bitline is electrically connected to a rear face of the first portion of the metal material and to a rear face of the second portion of the metal material.

12. The device of claim 11
    wherein a first resistive switching device comprises the portion of the first word line, the first portion of the resistive switching material, and the first portion of the metal material;
    wherein a second resistive switching device comprises the portion of the second word line, the second portion of the resistive switching material, and the second portion of the metal material; and
    wherein the second resistive switching device is positioned vertically above the first resistive switching device.

13. The device of claim 11 further comprising:
    a third wordline overlying the third dielectric material and the second wordline;
    a fourth dielectric material overlying the third word line;
    wherein the via structure is within the fourth dielectric material and the third wordline, wherein the via structure exposes a portion of the third wordline;
    wherein a front face of a third portion of the resistive switching material touches the portion of the third wordline; and
    wherein a third portion of the metal material touches a rear face of the third portion of the resistive switching material; and wherein a third resistive switching device comprises the portion of the third word line, the third portion of the resistive switching material, and the third portion of the metal material.

14. The device of claim 11 wherein the metal material is selected from a group consisting of: gold, silver, palladium, platinum, nickel, and aluminum.

15. The device of claim 11 wherein the resistive witching material is selected from a group consisting of: an amorphous silicon material, an amorphous silicon material that is not intentionally doped, an intrinsic semiconductor material, and a non-crystalline silicon material.

16. The device of claim 11 wherein the first wordline comprises a conductive material selected from a group consisting of: a doped polycrystalline silicon containing layer, a doped silicon germanium material, a metal silicide, a metal containing compound.

17. The device of claim 11 further comprising: the substrate having one or more transistor devices formed therein, wherein the one or more transistor devices are coupled to the bitline.

18. The device of claim 11 wherein the resistive switching material is conformally deposited within the via structure.

19. The device of claim 11
wherein the first wordline extends in a first direction relative to the substrate;
wherein the bit line extends in a second direction relative to the substrate; and
wherein the first direction and is orthogonal to the second direction.

20. The device of claim 11 wherein the metal material fills up the via structure.

* * * * *